United States Patent
Leirer et al.

(10) Patent No.: US 9,728,674 B2
(45) Date of Patent: Aug. 8, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Christian Leirer, Friedberg (DE); Tobias Meyer, Ihrlerstein (DE); Matthias Peter, Regensburg (DE); Juergen Off, Regensburg (DE); Joachim Hertkorn, Alteglofsheim (DE); Andreas Loeffler, Neutraubling (DE); Alexander Walter, Laaber (DE); Dario Schiavon, Regensburg (DE)

(73) Assignee: OSRAM Opto Semiconductors GmbH, Regensberg (DE)

( * ) Notice: Subject to any disclaimer, the term of this patent is extended or adjusted under 35 U.S.C. 154(b) by 0 days.

(21) Appl. No.: 15/285,447

(22) Filed: Oct. 4, 2016

(65) Prior Publication Data
US 2017/0025569 A1 Jan. 26, 2017

Related U.S. Application Data

(62) Division of application No. 14/430,198, filed as application No. PCT/EP2013/069816 on Sep. 24, 2013, now Pat. No. 9,502,611.

(30) Foreign Application Priority Data

Sep. 27, 2012 (DE) .......... 10 2012 217 640

(51) Int. Cl.
*H01L 29/06* (2006.01)
*H01L 33/06* (2010.01)
(Continued)

(52) U.S. Cl.
CPC .......... *H01L 33/06* (2013.01); *H01L 33/0025* (2013.01); *H01L 33/0075* (2013.01);
(Continued)

(58) Field of Classification Search
CPC . H01L 33/58; H01L 33/0025; H01L 33/0075; H01L 33/24; H01L 33/32
See application file for complete search history.

(56) References Cited

U.S. PATENT DOCUMENTS

2006/0246612 A1 11/2006 Emerson et al.
2008/0116477 A1 5/2008 Komada
(Continued)

FOREIGN PATENT DOCUMENTS

CN     1582520 A     2/2005
CN     101241851 A     8/2008
(Continued)

OTHER PUBLICATIONS

Danhof, J. et al., "Lateral charge carrier diffusion in InGaN quantum wells", Physica Status Solidi B, 249 (2012), No. 3, pp. 480-484.
(Continued)

*Primary Examiner* — Douglas Menz
(74) *Attorney, Agent, or Firm* — McDermott Will & Emery LLP

(57) ABSTRACT

The invention concerns an optoelectronic component comprising a layer structure with a light-active layer. In a first lateral region the light-active layer has a higher density of V-defects than in a second lateral region.

11 Claims, 13 Drawing Sheets

(51) Int. Cl.
*H01L 33/00* (2010.01)
*H01L 33/24* (2010.01)
*H01L 33/32* (2010.01)
*H01L 33/58* (2010.01)

(52) U.S. Cl.
CPC .............. *H01L 33/24* (2013.01); *H01L 33/32* (2013.01); *H01L 33/58* (2013.01)

(56) References Cited

U.S. PATENT DOCUMENTS

| | | | |
|---|---|---|---|
| 2009/0014713 | A1 | 1/2009 | Kang et al. |
| 2010/0052010 | A1 | 3/2010 | Yoon |
| 2010/0080660 | A1 | 4/2010 | Maier |
| 2010/0155704 | A1 | 6/2010 | Oh et al. |
| 2012/0080660 | A1 | 4/2012 | Jung et al. |
| 2012/0168753 | A1 | 7/2012 | Sanga |
| 2013/0082236 | A1 | 4/2013 | Ramer et al. |

FOREIGN PATENT DOCUMENTS

| | | |
|---|---|---|
| CN | 102687291 A | 9/2012 |
| DE | 102012104671 A1 | 12/2013 |
| EP | 2398076 A2 | 12/2011 |
| JP | 2006339534 A | 12/2006 |
| JP | 2008218746 A | 9/2008 |
| JP | 2011138842 A | 7/2011 |
| JP | 2011159721 A | 8/2011 |
| WO | WO-2010150809 A1 | 12/2010 |
| WO | WO-2011080219 A1 | 7/2011 |

OTHER PUBLICATIONS

Halder, S. et al., "Detection, binning, and analysis of defects in a GaN-on-Si process for High Brightness Light Emitting Diode's", ASMC, 2012, pp. 106-109.

Hangleiter, A. et al., "Suppression of Nonradiative Recombination by V-Shaped Pits in GaInN/GaN Quantum Wells Produces a Large Increase in the Light Emission Efficiency", Physical Review Letter, PRL 95, 127402 (2005), pp. 127402-1-127402-4.

Meneghini, M. et al., "Analysis of Defect-Related Localized Emission Processes in InGaN/GaN-Based LED's", IEEE Transactions of Electronic Devices, vol. 59, No. 5, May 2012, pp. 1416-1422.

Schiavon, D. et al., "Optically pumped GaInN/GaN multiple quantum wells for the realization of efficient green light-emitting devices", Applied Physics Letters, Mar. 20, 2013, vol. 102, pp. 113509-1-113509-4, Germany.

Schiavon, D. et al., "Wavelength-dependent determination of the recombination rate coefficients in single-quantum-well GaInN/GaN light emitting diodes," Physica Status Solidi B, Nov. 28, 2012, vol. 250 No. 2, pp. 283-290, Germany.

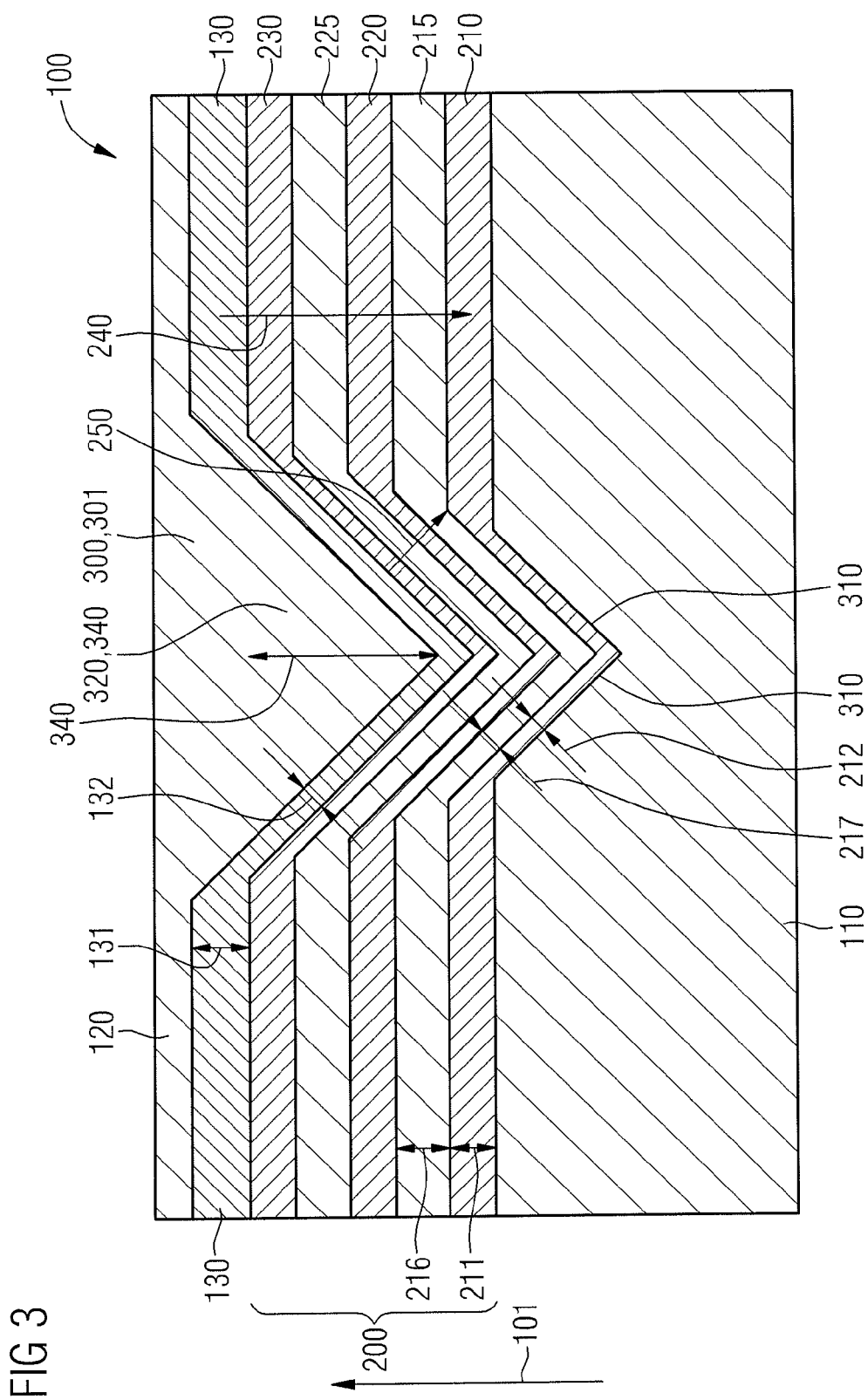

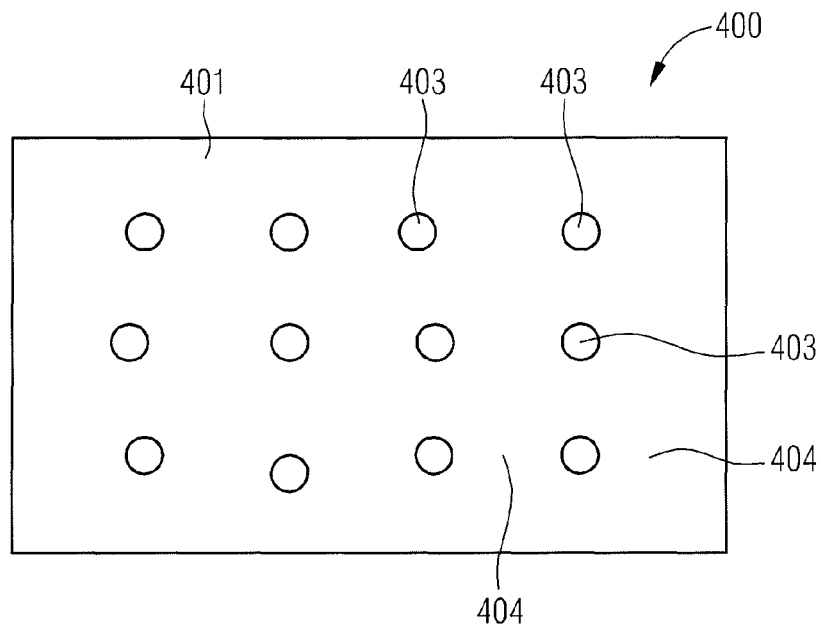
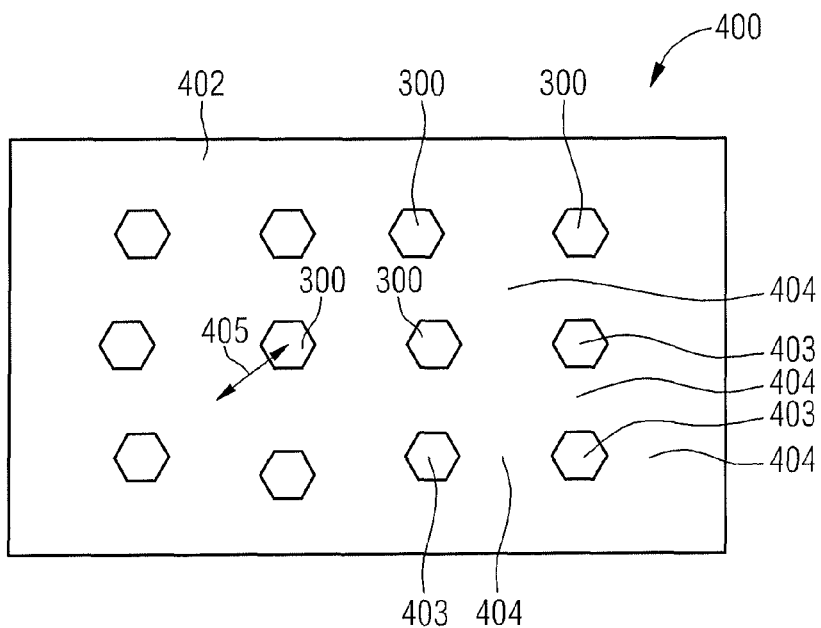

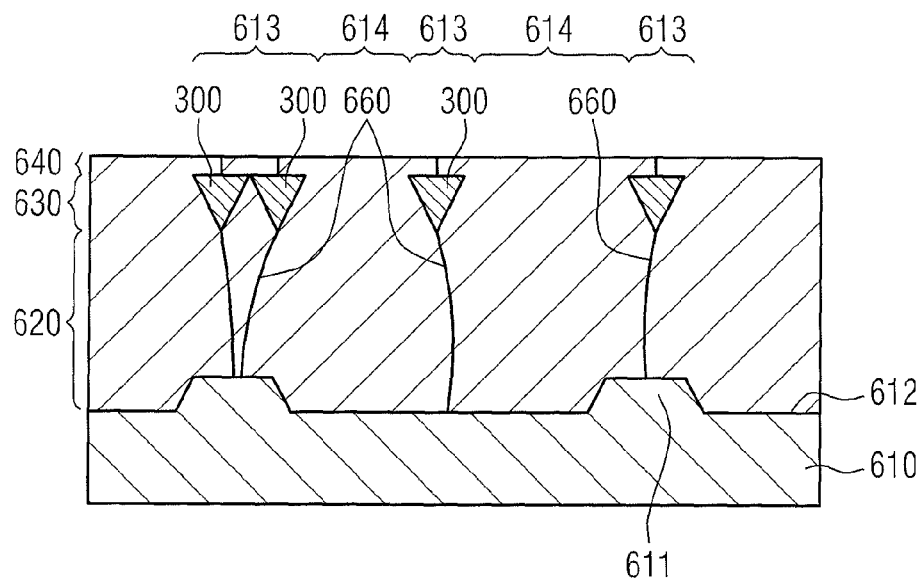
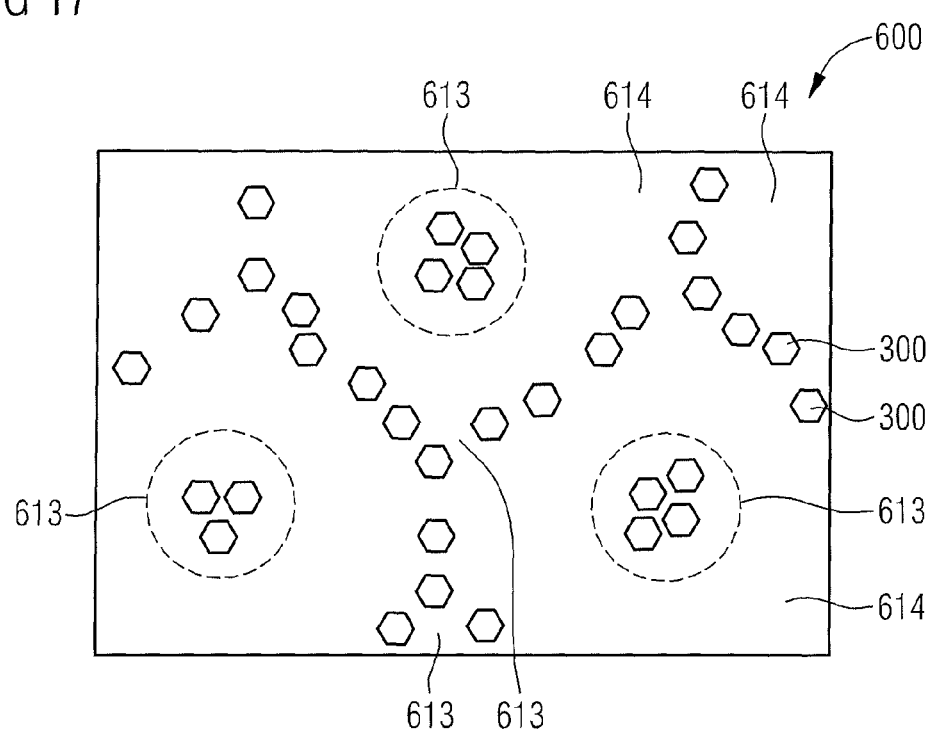

OPTOELECTRONIC COMPONENT AND METHOD FOR THE PRODUCTION THEREOF

CROSS-REFERENCES TO RELATED APPLICATIONS

This application is a divisional application of U.S. patent application Ser. No. 14/430,198, filed Mar. 20, 2015, which is the national stage of International Patent Application No. PCT/EP2013/069816, filed Sep. 24, 2013, which claims the benefit of priority under 35 U.S.C. §119 of German Patent Application No. 102012217640.3 filed on Sep. 27, 2012, all of which are hereby incorporated by reference in their entirety for all purposes.

DESCRIPTION

The present invention relates to an optoelectronic component and to a method for producing an optoelectronic component.

In the case of light emitting diodes which are based on semiconductors from the group III nitride material system, for example on InGaN—GaN, and have an active zone consisting of a plurality of quantum films (multi quantum well; MQW), the problem arises in the prior art that not all the quantum films are jointly operated optimally and homogeneously. This results in losses of efficiency for such light emitting diodes.

A charge carrier distribution over the plurality of quantum films arises as a result of a charge carrier injection into the quantum films along the growth direction of the semiconductor layer structure. Charge carrier injection and distribution that is as homogeneous as possible is desirable. However, this is prevented in particular by the barriers which are arranged between the quantum films and which must be overcome by the injected charge carriers. In particular a non-equilibrium between the positive charge carriers (holes) having poorer mobility that are injected from a p-doped side of the semiconductor layer structure and negative charge carriers (electrons) having better mobility that are injected from an n-doped side of the semiconductor layer structure leads to an inhomogeneous filling of the quantum films in particular to an inhomogeneous filling of the n-side quantum films, which reduces the efficiency of the light emitting diode. Quantum films situated nearer to the n-doped side of the semiconductor layer structure obtain fewer positive charge carriers than quantum films situated nearer to the p-doped side of the semiconductor layer structure.

The decrease in efficiency increases here with the number of quantum films. Furthermore, the effect is more pronounced, the longer emission wavelength of the light emitting diode.

One object of the present invention is to provide an improved optoelectronic component. This object is achieved by means of an optoelectronic component comprising the features of claim 1. A further object of the present invention is to specify an improved method for producing an optoelectronic component. This object is achieved by means of a method comprising the features of claim 12. Preferred developments are specified in the dependent claims.

An optoelectronic component comprises a layer structure comprising a luminous-active layer. In this case, the luminous-active layer has a higher density of V-defects in a first lateral region than in a second lateral region. Advantageously, charge carriers can then penetrate through the luminous-active layer more easily in the first lateral region than in the second lateral region. In this case, the charge carriers move through the V-defects. In this way, charge carriers within the luminous-active layer can be injected from the first lateral region into the second lateral region.

In one embodiment of the optoelectronic component, the luminous-active layer has a plurality of quantum films succeeding one another in the growth direction of the layer structure. Advantageously, the increased permeability of the luminous-active layer as a result of the V-defects arranged in the first lateral region then facilitates an injection of charge carriers into the quantum films of the luminous-active layer. This results in a filling of the quantum films of the luminous-active layer with increased homogeneity, which can advantageously lead to an improved efficiency of the optoelectronic component.

In one embodiment of the optoelectronic component, a barrier is formed between two quantum films. In this case, the barrier is thinner in the growth direction in the region of a V-defect than in the second lateral region. Advantageously, the barrier is then more permeable to charge carriers in the first lateral region than in the second lateral region. This has the consequence that charge carriers are preferably injected in the first lateral region through V-defects into the quantum films of the luminous-active layer.

In one embodiment of the optoelectronic component, a first quantum film has a lower indium concentration in the region of a V-defect than in the second lateral region. This advantageously has the consequence that the quantum film is more easily accessible for charge carriers in the first lateral region than in the second lateral region. As a result, the quantum film is advantageously preferably filled with charge carriers in the first lateral region.

In one embodiment of the optoelectronic component, at least some V-defects completely penetrate through the luminous-active layer in the growth direction of the layer structure. Advantageously, the luminous-active layer is thereby accessible over its entire thickness in the growth direction for charge carriers injected through the V-defects. This supports a homogeneous filling of the luminous-active layer with charge carriers.

In one embodiment of the optoelectronic component, the layer structure has a p-doped layer. In this case, the V-defects widen in the direction of the p-doped layer. Advantageously, positive charge carriers (holes) can thereby be injected particularly simply in the first lateral region through V-defects from the p-doped layer into the luminous-active layer.

In one embodiment of the optoelectronic component, the p-doped layer in the region of a V-defect extends into the V-defect. Advantageously, this additionally supports an injection of positive charge carriers from the p-doped layer through the V-defects into the luminous-active layer.

In one embodiment of the optoelectronic component, a separating layer is arranged between the luminous-active layer and the p-doped layer. In this case, the separating layer is thinner in the growth direction in the region of a V-defect than in the second lateral region. Advantageously, the separating layer is then more permeable to positive charge carriers in the first lateral region than in the second lateral region. This advantageously supports an injection of positive charge carriers from the p-doped layer of the layer structure into the luminous-active layer of the layer structure through the V-defects of the first lateral region.

In one embodiment of the optoelectronic component, an electrically conductive contact layer is arranged on the layer structure. In this case, the electrically conductive contact layer has an opening in the second lateral region. Advantageously, there is no need for current impression in the second lateral region since a charge carrier injection into the luminous-active layer is less efficient in the second lateral region than in the first lateral region anyway. As a result, the second lateral region can advantageously remain such that it is not covered by the electrically conductive contact layer. As a result, light can be emitted with reduced light absorption through the second lateral region, as a result of which the optoelectronic component can have an increased efficiency.

In one embodiment of the optoelectronic component, a contact and mirror layer is arranged on the layer structure. In this case, the contact and mirror layer comprises a different material in the first lateral region than in the second lateral region. Advantageously, the contact and mirror layer can thereby comprise a material having a particularly low contact resistance in the first lateral region and comprise a material having particularly high optical reflectivity in the second lateral region. This exploits the fact that there is no need for current impression in the second lateral region since a current flow is less efficient in the second lateral region than in the first lateral region anyway as a result of the absent injection of charge carriers through V-defects. The material having high optical reflectivity that is arranged in the second lateral region brings about a particularly effective reflection of light generated in the luminous-active layer and thereby enables said light to be coupled out particularly efficiently on a surface of the layer structure of the optoelectronic component that is situated opposite the contact and mirror layer.

In one embodiment of the optoelectronic component, the first lateral region forms a lateral lattice. This advantageously ensures that every point of the second lateral region is at a distance from a V-defect in the first lateral region that is not greater than a defined value in a lateral direction. A particularly effective injection of charge carriers from the first lateral region into the second lateral region within the luminous-active layer is advantageously ensured as a result.

A method for producing an optoelectronic component comprises steps for providing a substrate and for growing a layer structure onto the substrate. In this case, the layer structure comprises a luminous-active layer. In addition, in this case V-defects are embedded into the luminous-active layer. In this case, more V-defects per lateral area are embedded in a first lateral region of the luminous-active layer than in a second lateral region of the luminous-active layer. Advantageously, in the case of the layer structure of the optoelectronic component produced according to this method, charge carriers can be injected through the V-defects of the first lateral region into the second lateral region of the luminous-active layer, which supports a homogeneous filling of the luminous-active layer with charge carriers. This can advantageously contribute to an increased efficiency of the optoelectronic component.

In one embodiment of the method, a mask layer having an opening in the first lateral region is created before the growth of the luminous-active layer. Advantageously, threading defects can thereby continue through the opening of the mask layer in the first lateral region in the direction of the luminous-active layer, which entails there an increased probability of the formation of V-defects. This enables the mask layer to define the first lateral region and the second lateral region.

In one embodiment of the method, elevations are created at a surface of the substrate. Advantageously, the creation of the elevations at the surface of the substrate can influence the probability of formation of V-defects in the luminous-active layer above the elevation of the substrate. As a result, a definition of the first lateral region and of the second lateral region is made possible in this method as well.

In one embodiment of the method, an elevation is created at the surface of the substrate in the first lateral region. The elevation at the surface of the substrate advantageously brings about an increase in a probability of formation of V-defects in the luminous-active layer above the elevation, which results in a higher density of V-defects in the first lateral region above the elevation.

The above-described properties, features and advantages of this invention and the way in which they are achieved will become clearer and more clearly understood in association with the following description of the exemplary embodiments that are explained in greater detail in association with the drawings. Here in each case in a highly schematic illustration:

FIG. 3 shows a further section through the layer structure with a V-defect;

FIG. 4 shows a plan view of a prestructured surface of a further layer structure;

FIG. 5 shows a plan view of a luminous-active layer of the layer structure;

FIG. 16 shows a further section through this layer structure;

FIG. 17 shows a plan view of this layer structure;

Figure 1:
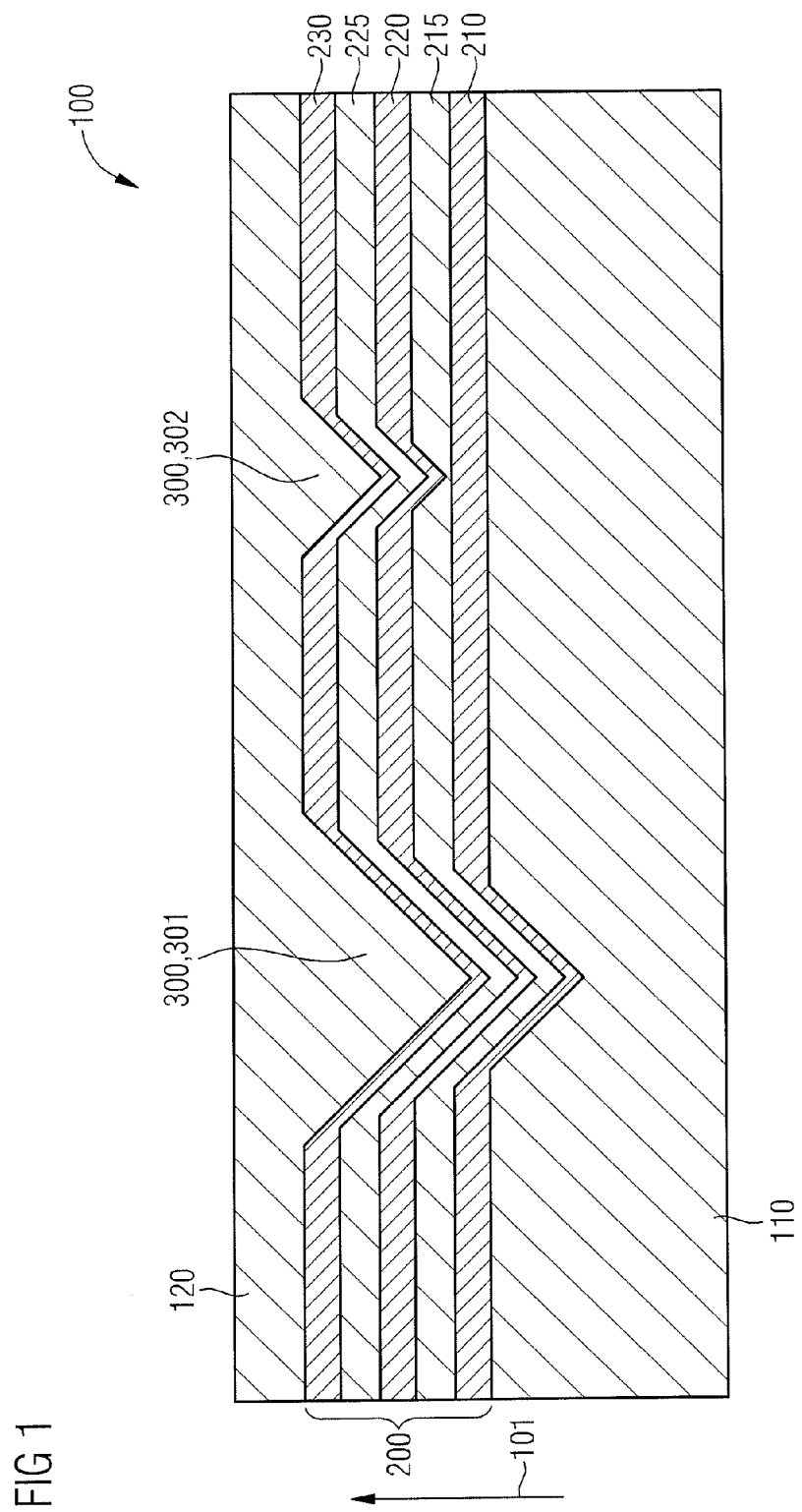
FIG. 1 shows a section through a layer structure of an optoelectronic component.

FIG. 1 shows a section through a part of a layer structure 100 in schematic illustration. The layer structure 100 is an epitaxially grown semiconductor layer structure. In particular, the layer structure 100 can be constructed from a group III nitride material system. The layer structure 100 can be used in an optoelectronic component, in particular in a light emitting diode.

In an epitaxial growth direction 101, an n-doped crystal 110, a luminous-active layer 200 and a p-doped crystal 120 succeed one another in the case of the layer structure 100. The layer structure 100 can be arranged on a substrate which is not illustrated in FIG. 1. Even further layers can be arranged between the substrate and that part of the layer structure 100 which is shown in FIG. 1. Even further layers can also be provided between the abovementioned layers 110, 200, 120 of the layer structure 100.

The luminous-active layer 200 comprises a plurality of quantum films which succeed one another in the growth direction 101 and are spaced apart from one another in each case by barriers. A first quantum film 210, a second quantum film 220 and a third quantum film 230 are present in the example shown in FIG. 1. The first quantum film 210 and the second quantum film 220 are separated from one another by a first barrier 215. The second quantum film 220 and the third quantum film 230 are separated from one another by a second barrier 225. The luminous-active layer 200 could also comprise a different number of quantum films. By way of example, the luminous-active layer 200 could comprise between four and ten quantum films succeeding one another in the growth direction 101. The luminous-active layer 200 could also comprise thirty or more quantum films succeeding one another in the growth direction 101.

The n-doped crystal 110 can for example comprise GaN and be doped with Si. The quantum films 210, 220, 230 of the luminous-active layer 200 can comprise InGaN, for example. The barriers 215, 225 between the quantum films 210, 220, 230 can comprise GaN, for example. The p-doped crystal 120 can for example comprise GaN and be doped with Mg.

Figure 2:
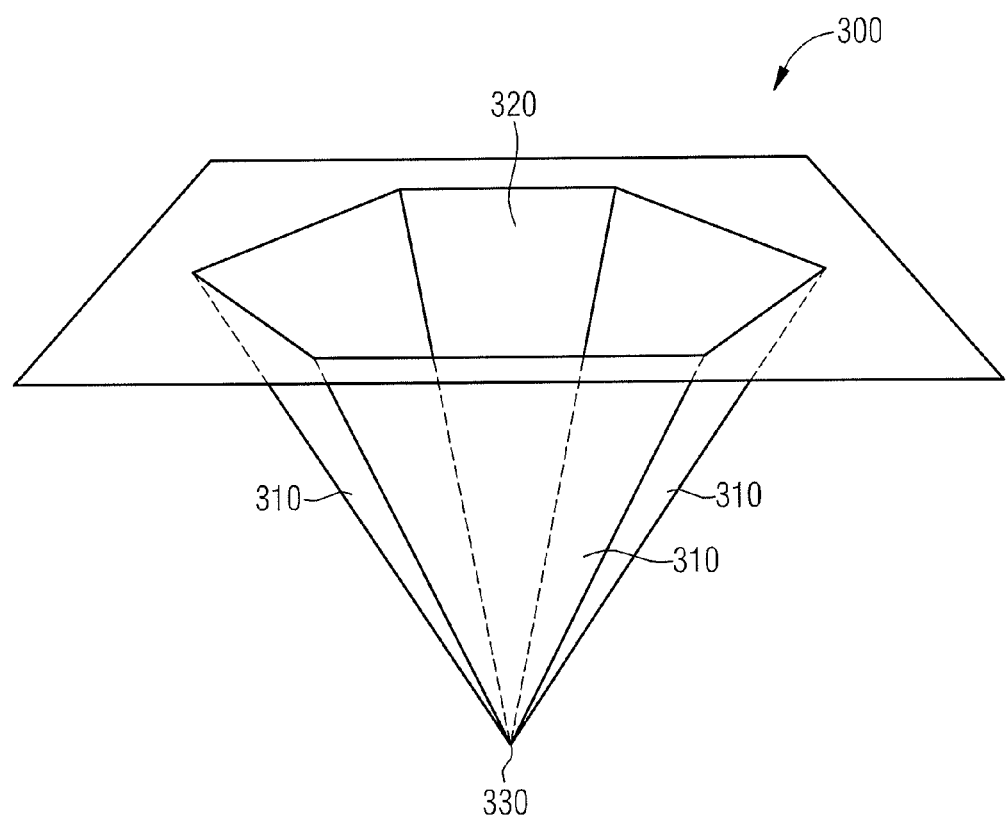
FIG. 2 shows a perspective illustration of a V-defect.

The layer structure 100 has two V-defects 300 in the region of the luminous-active layer 200. The V-defects 300 can also be designated as V-pits. FIG. 2 shows a schematic perspective illustration of a V-defect 300. Each V-defect 300 has the form of an inverse pyramid having typically 6 or 12 facets (flanks) 310. The number of facets 310 is dependent on the crystal structure of the surrounding crystal. In this case, the pyramidal V-defect 300 widens in the direction of the p-doped crystal 120 proceeding from a vertex 330 oriented in the direction of the n-doped crystal 110 and forms an opening 320 facing the p-doped crystal 120.

In the region of the V-defects 300, the layers of the layer structure 100 are not oriented perpendicularly to the usual growth direction 101, but rather parallel to, in particular, crystallographically predefined planes at an angle of between approximately 30 degrees and approximately 80 degrees relative to the usual growth direction 101.

The excerpt from the layer structure 100 as illustrated in FIG. 1 has two V-defects 300. A first V-defect 301 extends in the growth direction 101 through the entire luminous-active layer 200, that is to say encompasses all quantum films 210, 220 and 230 of the luminous-active layer 200 of the layer structure 100. A second V-defect 302 extends in the growth direction 101 only through a part of the luminous-active layer 200, that is to say encompasses only the first quantum film 210 and the second quantum film 220 in the example illustrated. The vertex 330 of the second V-defect 302 lies above the vertex 330 of the first V-defect 301 in the growth direction 101. During the growth of the layer structure 100, the production of the second V-defect 302 did not commence until at a later point in time than the production of the first V-defect 301. The production of the first V-defect 301 already commenced before the growth of the luminous-active layer 200. The production of the second V-defect 302 did not commence until during the growth of the luminous-active layer 200.

In one embodiment, a highest possible number of V-defects 300 completely penetrates through the luminous-active layer 200 in the growth direction 101 of the layer structure 100, as is the case for the first V-defect 301. In another embodiment, a great inhomogeneity of the sizes of the V-defects 300 is striven for.

A production of V-defects 300 can be initiated by means of suitable growth conditions during the epitaxial growth of the layer structure 100. The growth conditions in an MOVPE installation can in this case encompass temperatures of between 600° C. and 900° C. In this case, trimethylgallium or triethylgallium can be used as group III precursor.

FIG. 3 shows a further schematic sectional illustration of a part of the layer structure 100 with the first V-defect 300, 301. In contrast to FIG. 1, FIG. 3 shows an additional separating layer 130 of the layer structure 100, which is arranged between the luminous-active layer 200 and the p-doped crystal 120. The separating layer 130 can consist of undoped GaN. The separating layer 130 can serve to prevent a diffusion of doping atoms from the p-doped crystal 120 into the luminous-active layer 200.

The quantum films 210, 220, 230 and in particular the barriers 215, 225 of the luminous-active layer 200 have a smaller thickness in the region of the facets 310 of the V-defect 300 than outside the V-defect 300. By way of example, the first quantum film 210 has a first thickness 211 outside the V-defect 300 and a second thickness 212 in the region of the facets 310 of the V-defect 300. In this case, the first thickness 211 is greater than the second thickness 212. The first barrier 215 has a first thickness 216 outside the V-defect 300 and a second thickness 217 in the region of the facets 310 of the V-defect 300. The first thickness 216 is greater than the second thickness 217.

The smaller thickness 212, 217 of the layers 210, 215, 220, 225, 230 of the luminous-active layer 200 in the region of the facets 310 of the V-defect 300 facilitates an injection of positive charge carriers from the p-doped crystal 120 into the luminous-active layer 200 through the facets 310 of the V-defect 300 in comparison with an injection of positive charge carriers from the p-doped crystal 120 into the luminous-active layer 200 outside the V-defect 300. Consequently, a transport of positive charge carriers along a first transport direction 240 antiparallel to the growth direction 101 in a lateral region outside the V-defect 300 is less probable than a transport along a second transport direction 250 through the facets 310 of the V-defect 300.

For the increased permeability it is important, in particular, that the barriers 215, 225 have a smaller thickness 217 in the region of the facets 310 than in a lateral region outside the V-defect 300. The thickness of the quantum films 210, 220, 230 can be less significant and in the region of the facets 310 need not necessarily differ from the thickness 211 in a lateral region outside the V-defect 300.

The quantum films 210, 220, 230 of the luminous-active layer 200 can have a lower indium content in the region of the facets 310 of the V-defect 300 than in a lateral region outside the V-defect 300. As a result, the band edge profile in the growth direction 101 in the region of the V-defect 300 is altered in comparison with a lateral region outside the V-defect 300. This also facilitates a transport of charge carriers along the second transport direction 250 in comparison with a transport along the first transport direction 240.

The reduced thickness of the layers 210, 215, 220, 225, 230 of the luminous-active layer 200 in the region of the V-defect 300 and the reduced indium content of the quantum films 210, 220, 230 in the region of the V-defect 300 can be controlled by means of suitable growth conditions such as pressure, temperature, V/III ratio, H2/N2 ratio and growth rate. In particular, the growth temperature during the growth of the luminous-active layer 200 can be less than 950 degrees Celsius and the growth pressure can be above 10 mbar if the growth is carried out in a group III nitride MOVPE.

FIG. 3 shows that the separating layer 130 in the region of the facets 310 of the V-defect 300 also has a second thickness 132, which is reduced in comparison with a first thickness 131 of the separating layer 130 in a lateral region outside the V-defect 300. This is not absolutely necessary, but likewise facilitates an injection of positive charge carriers (holes) from the p-doped crystal 120 into the luminous-active layer 200 along the second transport direction 200 through the facets 310 of the V-defect 300 in comparison with an injection along the first transport direction 240 in a lateral region outside the V-defect 300. Preferably, the first thickness 131 of the separating layer 130 in a lateral region outside the V-defect 300 is at least 4 nm. The second thickness 132 of the separating layer 130 in the facets 310 of the V-defect 300 is preferably less than 8 nm.

The opening 320 of the V-defect 300 faces the p-doped crystal 120 of the layer structure 100. The opening 320 of the V-defect 300 has a filling 340 formed from the material of the p-doped crystal 120. Consequently, the p-doped crystal 120 in the region of the V-defect 300 extends into the V-defect 300.

In this case, the filling 340 or the extent of the p-doped crystal 120 into the V-defect 300 has a depth 341. This depth 341 preferably corresponds to at least the sum of the thicknesses of two quantum films 220, 230 and a barrier 225 in a lateral region of the layer structure 100 outside the V-defect 300. If the luminous-active layer 200 comprises five quantum films 210, 220, 230, then the depth 341 is preferably between 10 nm and 400 nm, in particular between 20 nm and 100 nm. A high depth 341 can be achieved by virtue of the fact that the production of the V-defect 300 is already initiated before the growth of the luminous-active layer 200 or at an early point in time during the growth of the luminous-active layer 200. The production of the first V-defect 300, 301 illustrated in FIG. 3 already commenced before the epitaxial growth of the luminous-active layer 200, as a result of which the vertex 330 of the V-defect 300, 301 is arranged below the luminous-active layer 200 in the growth direction 301 and the V-defect 300, 301 has a sufficient depth 341.

The filling 340 of the opening 320 of the V-defect 300 with the material of the p-doped crystal 120 together with the smaller thickness 212, 217 of the layers 210, 215, 220, 225, 230 of the luminous-active layer 200 in the region of the facets 310 of the V-defect 300 likewise brings about an injection of positive charge carriers along the second transport direction 250 through the facets 310 of the V-defect 300 which is facilitated in comparison with an injection along the first transport direction 240 in a lateral region outside the V-defect 300.

As was explained above, in the region of the V-defect 300 an injection of charge carriers, in particular an injection of positive charge carriers from the p-doped crystal 120, is facilitated in comparison with an injection in a lateral region of the layer structure 100 and the luminous-active layer 200 outside the V-defect 300. This can be associated with the fact that the luminous-active layer 200 has a lower series resistance in the region of the V-defect 300 than in a lateral region outside the V-defect 300. As a result, an improved filling of the quantum films 210, 220, 230 of the luminous-active layer 200 with charge carriers is possible in the region of the V-defect 300.

The charge carriers injected into the quantum films 210, 220, 230 in the region of the V-defect 300 can pass into lateral regions outside the V-defect 300 by diffusion if said lateral regions are at a distance from the V-defect 300 which is typically of the order of magnitude of the charge carrier diffusion length, in particular the hole diffusion length. In this case, the distance can be between 0.2 μm and 10 μm, for example.

Charge carriers injected into the quantum films 210, 220, 230 of the luminous-active layer 200 in the region of the V-defect 300 can thereby recombine in lateral regions of the luminous-active layer 200 outside the V-defect. In particular, a radiative recombination of the charge carriers injected into the quantum films 210, 220, 230 can take place in lateral regions of the luminous-active layer 200 outside the V-defect 300.

The layer structure 100 has a plurality of V-defects 300. Preferably, the V-defects 300 are distributed in the lateral direction of the layer structure 100 in such a way that each lateral portion of the luminous-active layer 200 in a lateral direction is at most at a maximum distance from a V-defect 300 which corresponds approximately to the charge carrier diffusion length, in particular approximately to the hole diffusion length. This ensure that each lateral portion of the luminous-active layer 200 of the layer structure 100 can be supplied with charge carriers injected through V-defects 300.

The lateral arrangement of the V-defects 300 in the luminous-active layer 200 of the layer structure 100 can be defined or at least influenced during the production of the layer structure 100. It is known that V-defects form in particular in crystal regions having crystal defects, in particular threading defects. In this case, V-defects can form directly at the threading defects. A lateral density of such defects can be influenced during the production of the layer structure 100 by means of a prestructuring of a substrate or of a layer of the layer structure 100. It is thus also possible to predefine a lateral density of V-defects 300 in different lateral portions of the luminous-active layer 200 of the layer structure 100.

FIG. 4 shows a plan view of a layer structure 400 in schematic illustration. The layer structure 400 has a prestructured surface 401. The prestructured surface 401 can be a surface of a substrate onto which the rest of the layer structure 400 is grown. However, the prestructured surface 401 can also be a surface of a layer of the layer structure 400 that has already been grown onto a substrate.

The prestructured surface 401 is structured in such a way that it has structures which are arranged approximately regularly and which jointly form a first lateral region 403. The remaining portions of the prestructured surface 401 form a second lateral region 404. In the example illustrated, the structures of the first lateral region 403 are embodied in the shape of circular disks and are arranged approximately at the nodes of a rectangular lattice. However, the individual structures could also be shaped differently and arranged differently. By way of example, the structures of the first lateral region 403 could be arranged at the nodes of a hexagonal lattice.

FIG. 5 shows in schematic illustration a plan view of a luminous-active layer 402 of the layer structure 400 which was grown above the prestructured surface 401. Above every structure or almost every structure of the first lateral region 403, a V-defect 300 has formed in the luminous-active layer 402. Consequently, the first lateral region 403 has a higher density of V-defects 300 than the second lateral region 404.

Each lateral portion of the second lateral region 404 is maximally at a distance 405 from a closest V-defect 300. The distance 405 is of the order of magnitude of the charge carrier diffusion length, in particular the hole diffusion length. The distance 405 may be between 0.2 μm and 10 μm, for example.

Figure 6:
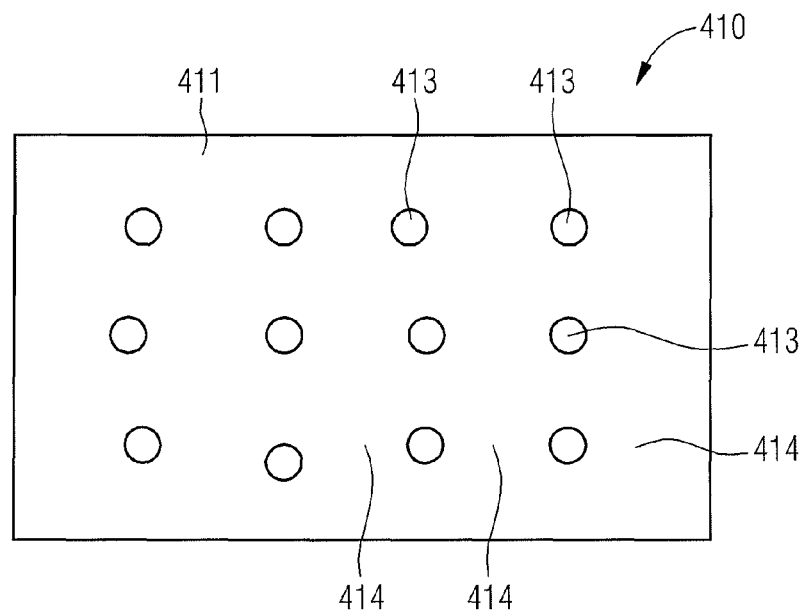
FIG. 6 shows a plan view of a prestructured surface of a further layer structure.

FIG. 6 shows a plan view of a prestructured surface 411 of a layer structure 410 in schematic illustration. The prestructured surface 411 can once again be a surface of a substrate onto which the rest of the layer structure 410 is grown. The prestructured surface 411 can also be the surface of an epitaxially grown layer of the layer structure 410.

The prestructured surface 411 once again has structures which are arranged regularly and which jointly form a first lateral region 413. In the example illustrated, the structures of the first lateral region 413 are once again arranged near the nodes of a rectangular lattice, but could also be arranged differently. The remaining portions of the prestructured surface 411 form a second lateral region 414.

Figure 7:
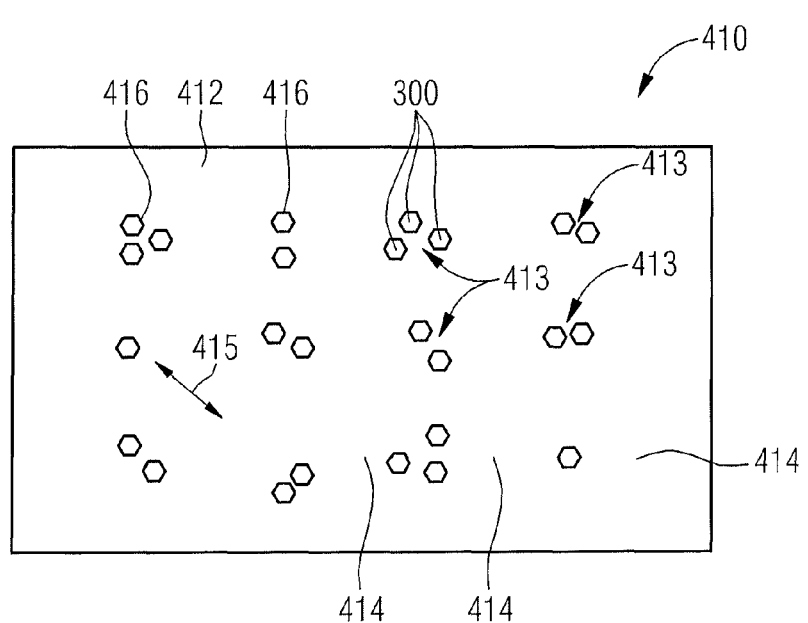
FIG. 7 shows a plan view of a luminous-active layer of this layer structure.

FIG. 7 shows a plan view of a luminous-active layer 412 of the layer structure 410 in schematic illustration. The luminous-active layer 412 was produced above the prestructured surface 411 by epitaxial growth. In this case, groups 416 of V-defects 300 have in each case formed above the structures of the prestructured surface 411 which form the first lateral region 413. One or a plurality of V-defects 300 are arranged above each structure of the first lateral region 413. Consequently, the first lateral region 413 of the luminous-active layer 412 has a higher density of V-defects 300 than the second lateral region 414.

In this case, each lateral portion of the second lateral region 414 is maximally at a distance 415 from a closest V-defect 300 which is of the order of magnitude of the charge carrier diffusion length, in particular the hole diffusion length. The distance 415 can once again be between 0.2 μm and 10 μm, for example.

Figure 8:
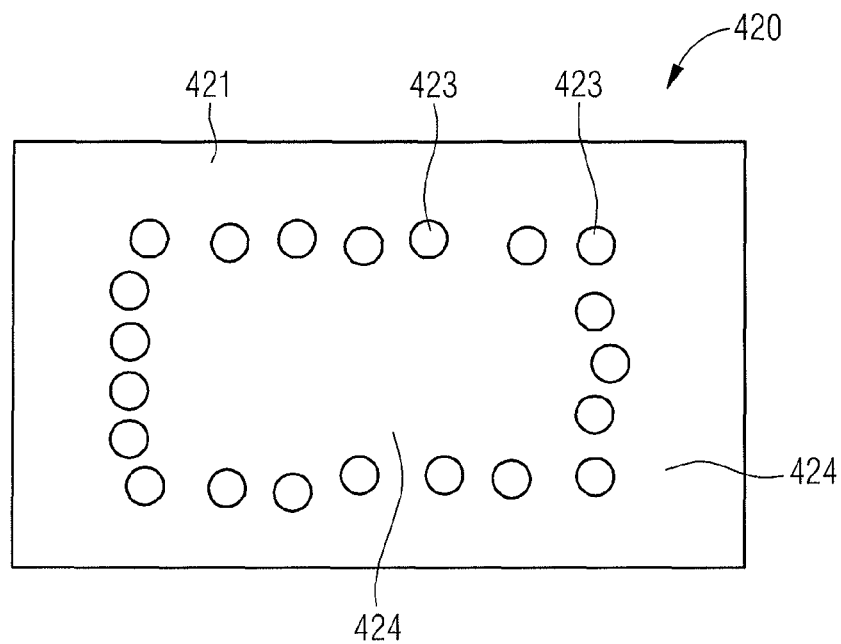
FIG. 8 shows a plan view of a prestructured surface of a further layer structure.

FIG. 8 shows a plan view of a prestructured surface 421 of a layer structure 420 in schematic illustration. The prestructured surface 421 can be a surface of a substrate onto which the rest of the layer structure 420 is grown. However, the prestructured surface 421 can also be a surface of an epitaxially grown layer of the layer structure 420.

The prestructured surface 421 has structures which jointly form a first lateral region 423. In this case, the structures are arranged along the edges of a rectangle and are formed in each case approximately in the shape of a circular disk. The remaining portions of the prestructured surface 421 form a second lateral region 424.

Figure 9:
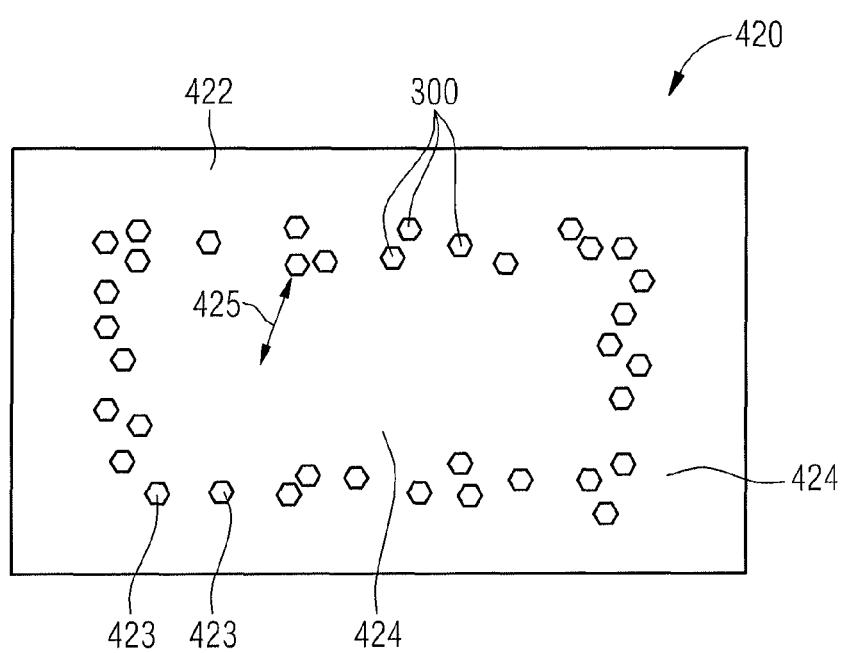
FIG. 9 shows a plan view of a luminous-active layer of this layer structure.

FIG. 9 shows a plan view of a luminous-active layer 422 of the layer structure 420 in schematic illustration. The luminous-active layer 422 was produced epitaxially above the prestructured surface 421 of the layer structure 420. In this case, V-defects 300 formed in the first lateral region 423. As a result, the first lateral region 423 of the luminous-active layer 422 has a higher density of V-defects 300 than the second lateral region 424.

Each lateral portion of the second lateral region 424 is at most at a distance 425 from a closest V-defect 300 of the first lateral region 423. The distance 425 is of the order of magnitude of the charge carrier diffusion length, in particular the hole diffusion length, and can be between 0.2 μm and 10 μm, for example.

Figure 10:
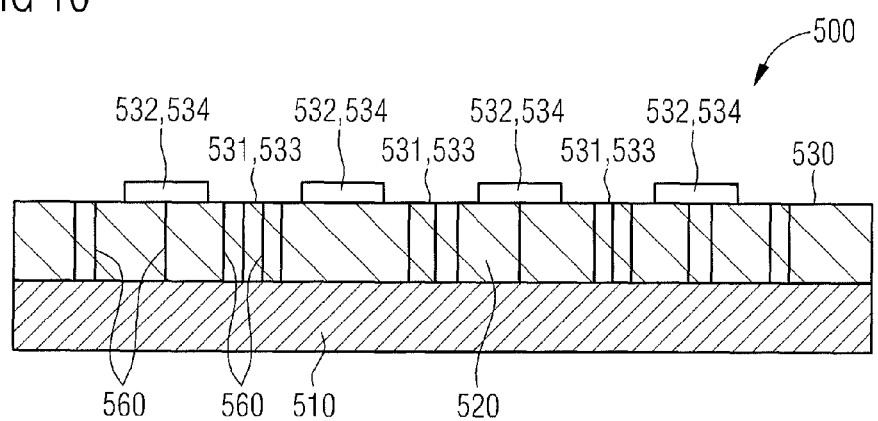
FIG. 10 shows a section through a further layer structure with a mask layer.

FIG. 10 shows a section through an unfinished layer structure 500 in schematic illustration. The layer structure 500 comprises a substrate 510. The substrate 510 can comprise sapphire, SiC or Si, for example.

A semiconductor layer 520 is arranged on the substrate 510, which semiconductor layer was grown epitaxially. The semiconductor layer 520 can comprise GaN, for example. The semiconductor layer 520 has a plurality of defects 560 which extend in a vertical direction or growth direction through the semiconductor layer 520. The defects 560 can be threading dislocations, in particular.

Figure 11:
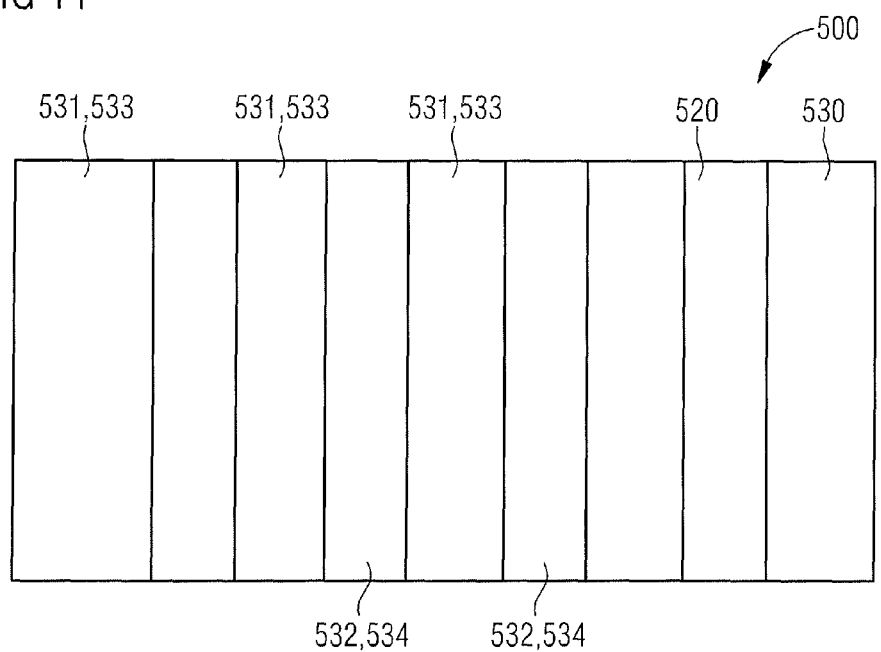
FIG. 11 shows a plan view of the mask layer of this layer structure.

A structured mask layer 530 is arranged on the semiconductor layer 520 of the layer structure 500. FIG. 11 shows a schematic plan view of the mask layer 530. The mask layer 530 can comprise SiO2 or SiN, for example.

The structured mask layer 530 has openings which jointly form an open region 531 of the mask layer 530. Regions of the semiconductor layer 520 that are covered by the mask layer 530 jointly form a covered region 532. The open region 531 forms a first lateral region. The covered region 532 forms a second lateral region 534.

The first lateral region 533 can have for example the shape of the first lateral region 403 of the layer structure 400, the shape of the first lateral region 413 of the layer structure 410 or the shape of the first lateral region 423 of the layer structure 420. However, the first lateral region 533 and the second lateral region 534 can also be embodied as alternating strips, as is illustrated schematically in the plan view in FIG. 11. Those portions of the covered region 532 of the mask layer 530 which form the second lateral region 534 preferably have a width of between approximately 3 μm and approximately 8 μm. The distances between two portions of the covered region 532, that is to say the width of the portions of the open region 531, preferably have magnitudes of between 1 μm and 10 μm.

Figure 12:
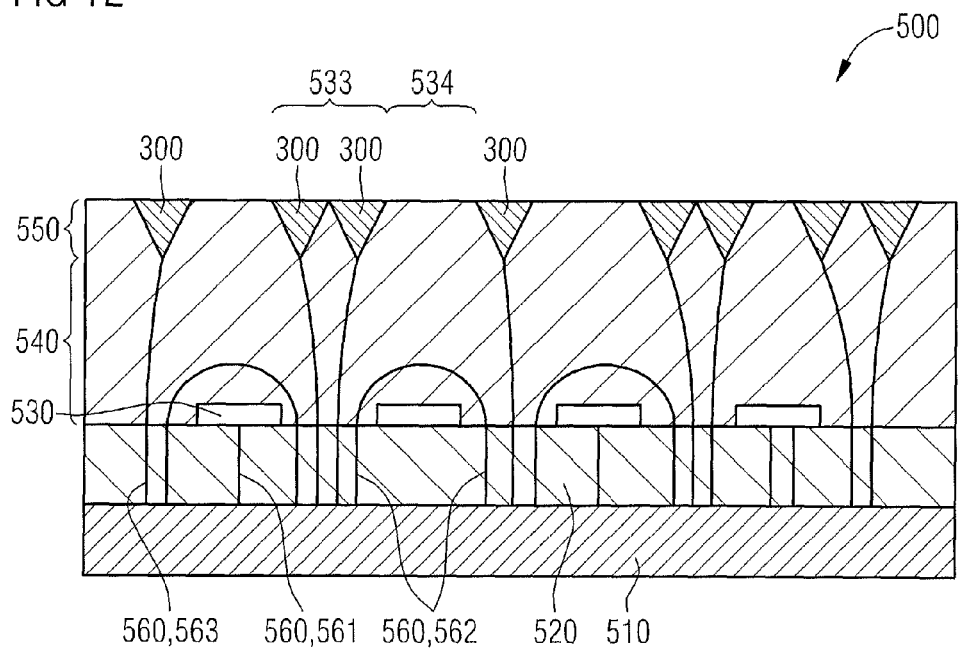
FIG. 12 shows a further section through this layer structure.
Figure 13:
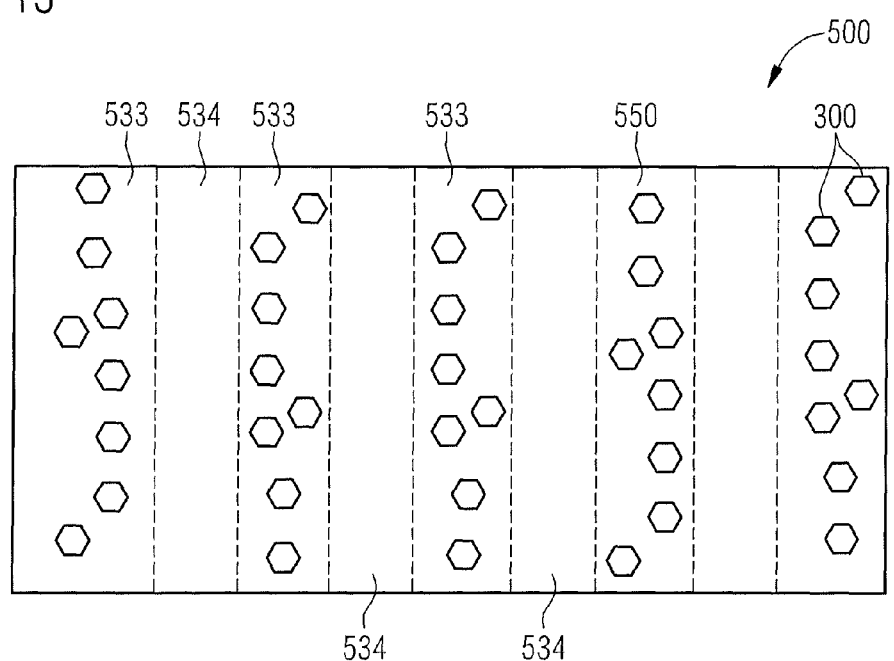
FIG. 13 shows a plan view of a luminous-active layer of this layer structure.

FIG. 12 shows a schematic illustration of a further section through the layer structure 500 after a further semiconductor layer 540 and a luminous-active layer 550 were grown. FIG. 13 shows a plan view of the luminous-active layer 550 in schematic illustration.

The further semiconductor layer 540 can comprise GaN and be n-doped. The further semiconductor layer 540 of the layer structure 500 then corresponds to the n-doped crystal 110 of the layer structure 100. The luminous-active layer 550 corresponds to the luminous-active layer 200 of the layer structure 100 and can be constructed like the latter.

During the growth of the further semiconductor layer 540, the defects 560 arranged in the first lateral region 533, that is to say below the open mask regions 531, continued as continued defects 563 from the semiconductor layer 520 through the further semiconductor layer 540 in the growth direction of the layer structure 500. Some of the defects 560 arranged in the first lateral region 533 of the semiconductor layer 520 also canceled one another out as canceled defects 562 during the growth of the further semiconductor layer 540. Defects 560 arranged in the second lateral region 534 of the semiconductor layer 520 below the covered mask regions 532, as blocked defects 561, did not continue in the growth direction of the layer structure 500 through the further semiconductor layer 540.

Consequently, defects 560, 563 continued through the further semiconductor layer 540 substantially only in the first lateral region 533. During the growth of the luminous-active layer 550, the defects 560, 563 brought about a higher probability of the production of V-defects 300. Consequently, more V-defects 300 per lateral area formed in the first lateral region 533 of the luminous-active layer 550 than in the second lateral region 534 of the luminous-active layer 550. The luminous-active layer 550 thus has a higher density of V-defects 300 in the first lateral region 533 than in the second lateral region 534.

Figure 14:
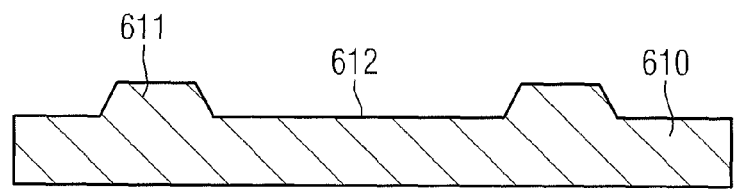
FIG. 14 shows a section through a substrate of a further layer structure.
Figure 15:
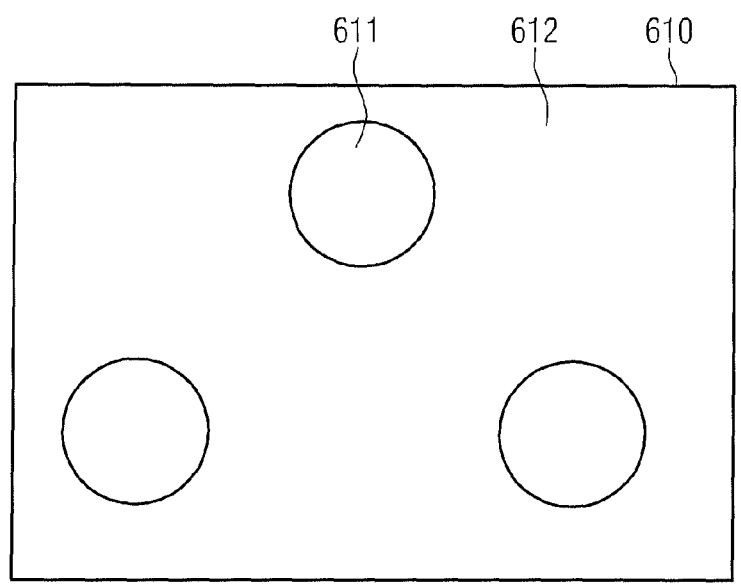
FIG. 15 shows a plan view of this substrate.

FIG. 14 shows a section through a substrate 610 in schematic illustration. FIG. 15 shows a plan view of a surface of the substrate 610 in schematic illustration. The substrate 610 comprises sapphire.

The surface of the substrate 610 is structured in such a way that elevations 611 are formed, which are separated from one another by depressions 612. The elevations 611 can also be designated as domes. In the example illustrated, the elevations 611 are embodied as round truncated cones.

The elevations 611 and depressions 612 of the substrate 610 can serve to improve coupling-out of light from a layer structure grown on the substrate 610 and an optoelectronic component formed therefrom. However, the elevations 611 and depressions 612 can also bring about a lateral modulation of a distribution of V-defects in a luminous-active layer arranged above the substrate 610. The elevations 611 can have a diameter of between 2 µm and 4 µm, for example. A distance between two adjacent elevations 611 can be between 0.5 µm and 6 µm, for example.

FIG. 16 shows in schematic illustration a section through a layer structure 600 which was produced by epitaxial growth on the surface of the substrate 610. In this case, a semiconductor layer 620, a luminous-active layer 630 and a further semiconductor layer 640 were grown successively in the growth direction. FIG. 17 shows a plan view of the luminous-active layer 630 in schematic illustration.

The semiconductor layer 620 can comprise GaN and be n-doped. The semiconductor layer 520 then corresponds to the n-doped crystal 110 of the layer structure 100. The luminous-active layer 630 can correspond to the luminous-active layer 200 of the layer structure 100 and can be constructed like the latter. The further semiconductor layer 640 can comprise GaN and be p-doped. The further semiconductor layer 640 can correspond to the p-doped crystal 120 of the layer structure 100.

The growth of the semiconductor layer 620 proceeded from the elevations 611 and continued from there both in a vertical direction (the main growth direction) and in a lateral direction into the depressions 612. In this case, a higher number of defects 660 arose in the lateral region above the elevations 611 than in other lateral regions of the semiconductor layer 620. More defects 660 also formed in the centers of the depressions 612 between two elevations 611, where two parts of the semiconductor layer 620 continuing in a lateral direction butted against one another. The defects 660 can once again be, in particular, threading dislocations which continue in a vertical direction, that is to say the main growth direction, through the semiconductor layer 620.

In the luminous-active layer 630, the defects 660 brought about a higher probability of production of V-defects 300. Consequently, above the elevations 611 of the substrate 610 and above the centers of the depressions 612 between two elevations 611 of the substrate 610, more V-defects 300 per lateral area formed than in other lateral regions of the luminous-active layer 630. These regions form a first lateral region 630 of the luminous-active layer 630, in which region V-defects 300 occur with higher density. The remaining lateral regions of the luminous-active layer 630 form a second lateral region 614, in which V-defects 300 occur with lower density.

The lateral geometry of the first lateral region 613 and of the second lateral region 614, as an alternative to the triangular lattice illustrated in FIGS. 14 to 17 can also correspond to those of the lateral regions 403, 404 of the layer structure 400, of the lateral regions 413, 414 of the layer structure 410 or of the lateral regions 423, 424 of the layer structure 420.

Figure 18:
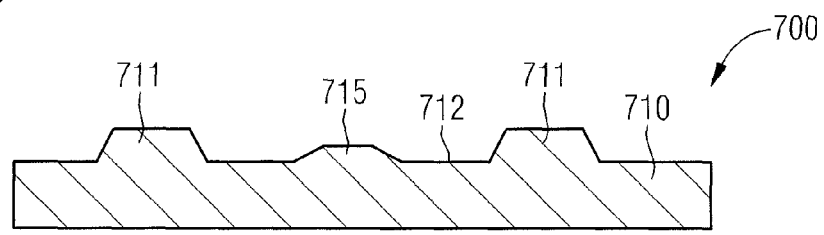
FIG. 18 shows a section through a substrate of a further layer structure.
Figure 19:
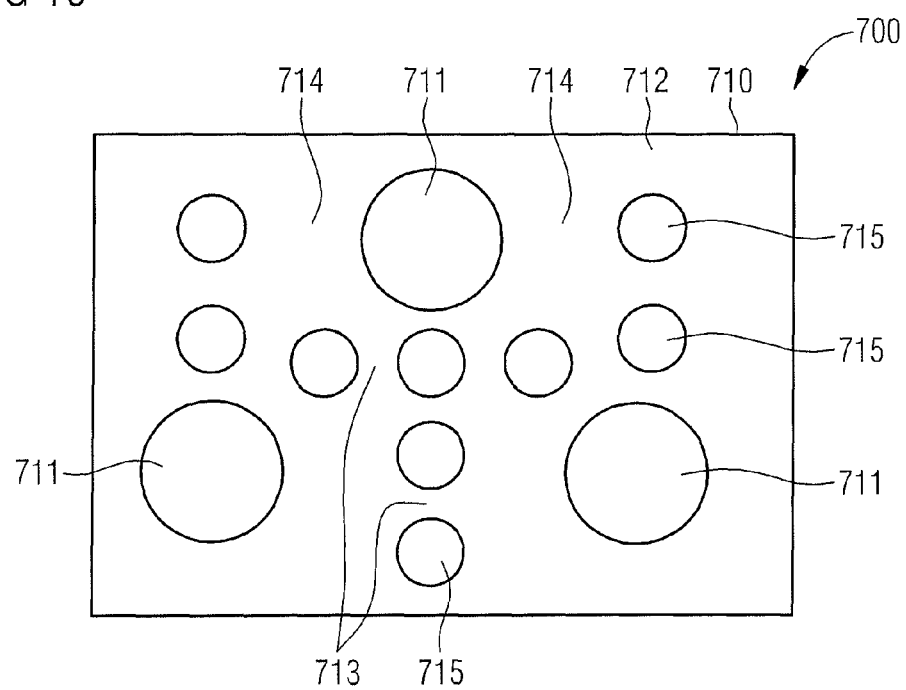
FIG. 19 shows a plan view of this substrate.

FIG. 18 shows a section through a substrate 710 in schematic illustration. FIG. 19 shows a plan view of a surface of the substrate 710 in schematic illustration. The substrate 710 once again comprises sapphire.

The surface of the substrate 710 is structured and has high elevations 711, which are spaced apart from one another by depressions 712. In addition, the surface of the substrate 710 has low elevations 715, which are embodied with a smaller height than the high elevations 711 in a direction perpendicular to the surface of the substrate 710. The low elevations 715 can also have a smaller diameter than the high elevations 711 in a lateral direction. It is also possible for the low elevations 715 to have a different shape than the high elevations 711 or to be provided in a deviating number per lateral area.

The high elevations 711 and the low elevations 715 at the surface of the substrate 710 jointly serve to improve coupling-out of light from a layer structure 700 produced by epitaxial growth on the substrate 710. The high elevations 711 additionally bring about the occurrence of V-defects with higher density in lateral regions of a luminous-active layer of the layer structure 700 above the high elevations 711 and in abutment regions centrally between adjacent high elevations 711. By contrast, the low elevations 715 do not significantly influence the occurrence of V-defects. Consequently, in the case of the layer structure 700, too, the regions in which the high elevations 711 are arranged and the regions centrally between adjacent high elevations 711 jointly form a first lateral region 713, while the remaining lateral portions form a second lateral region 714. In a luminous-active layer of the layer structure 700, a density of V-defects is higher in the first lateral region 713 than in the second lateral region 714.

Figure 20:
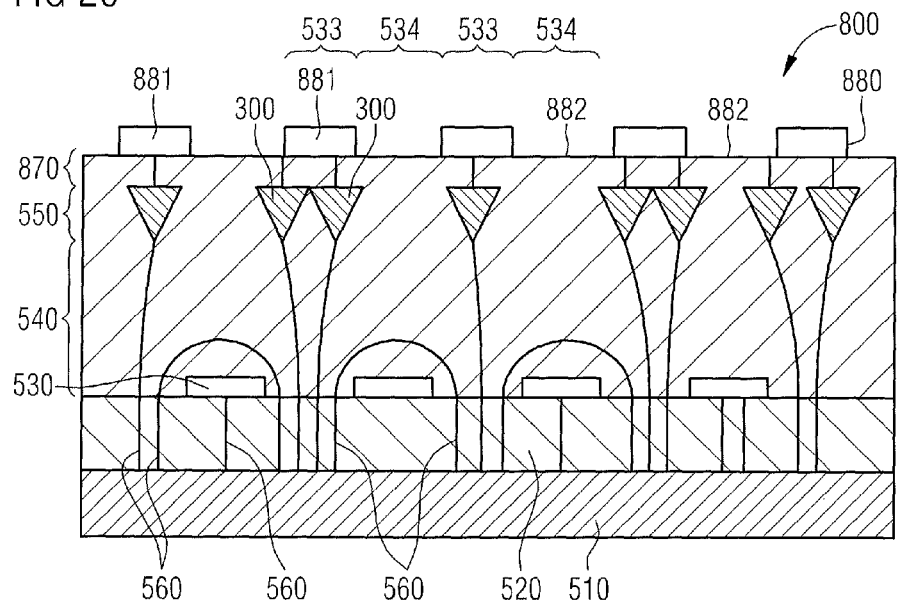
FIG. 20 shows a section through a further layer structure.

FIG. 20 shows a section through a further layer structure 800 in schematic illustration. The layer structure 800 has correspondences to the layer structure 500 from FIG. 12. Corresponding component parts are therefore provided with the same reference signs as therein.

In particular, the layer structure 800 has a luminous-active layer 550 in which there is a higher density of V-defects 300 in a first lateral region 533 than in a second lateral region 534. In the example illustrated, this was achieved according to the method explained with reference to FIGS. 10 to 13. It would also be possible, however, for the density of the V-defects 300 in the luminous-active layer 550 to be laterally modulated according to one of the method explained with reference to FIGS. 14 to 19.

In the case of the layer structure 800, a further semiconductor layer 870 was grown on the luminous-active layer 550. The further semiconductor layer 870 can comprise GaN and be p-doped. The further semiconductor layer 870 can correspond to the p-doped crystal 120 of the layer structure 100.

Figure 21:
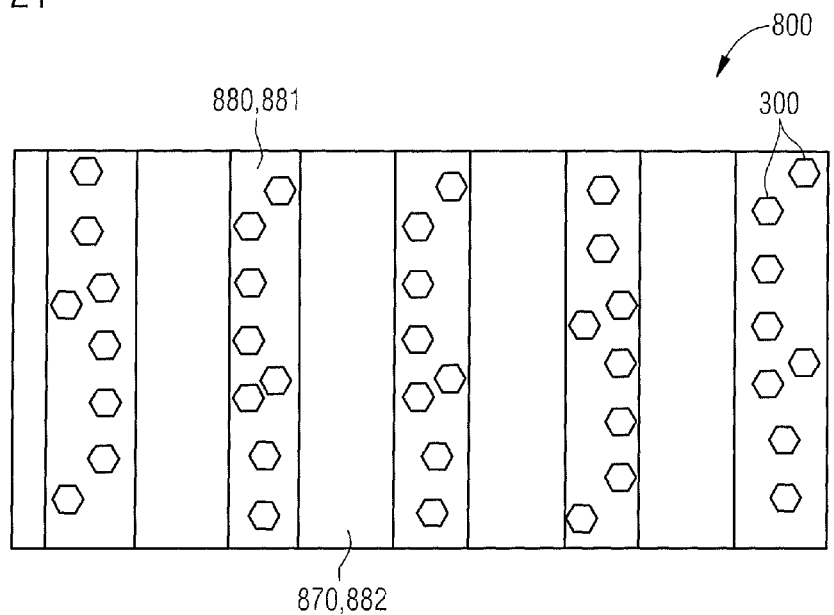
FIG. 21 shows a plan view of this layer structure.

A contact layer 880 was applied to the further semiconductor layer 870. The contact layer 880 comprises an electrically conductive material, for example a metal. The contact layer 880 serves to produce an electrically conductive connection to the further semiconductor layer 870, in order to enable a current flow through the semiconductor layer 870, the luminous-active layer 550 and the semiconductor layer 540. FIG. 21 shows a plan view of the contact layer 880.

The contact layer 880 is not embodied in a continuous fashion in a lateral direction, but rather has closed regions 881 and open regions 882. In this case, the closed regions 881 are arranged above the first lateral regions 533 of the luminous-active layer 550 in a vertical direction (the growth direction of the layer structure 800). The open regions 882 are arranged above the second lateral regions 534 of the luminous-active layer 550 in a vertical direction. This exploits the fact that an injection of charge carriers into the luminous-active layer 550 in a vertical direction preferably takes place via the V-defects 300 in the first lateral region 533. Therefore, there is no need for current impression into the further semiconductor layer 870 above the second lateral region 534.

Electromagnetic radiation generated in the luminous-active layer 550 by recombination of charge carriers injected into the luminous-active layer 550 can leave the layer structure 800 through the further semiconductor layer 870. In this case, no absorption of the electromagnetic radiation takes place in the open regions 882 of the contact layer 880, as a result of which overall more electromagnetic radiation can leave the layer structure 800. The efficiency of an optoelectronic component produced from the layer structure 800 increases as a result.

Figure 22:
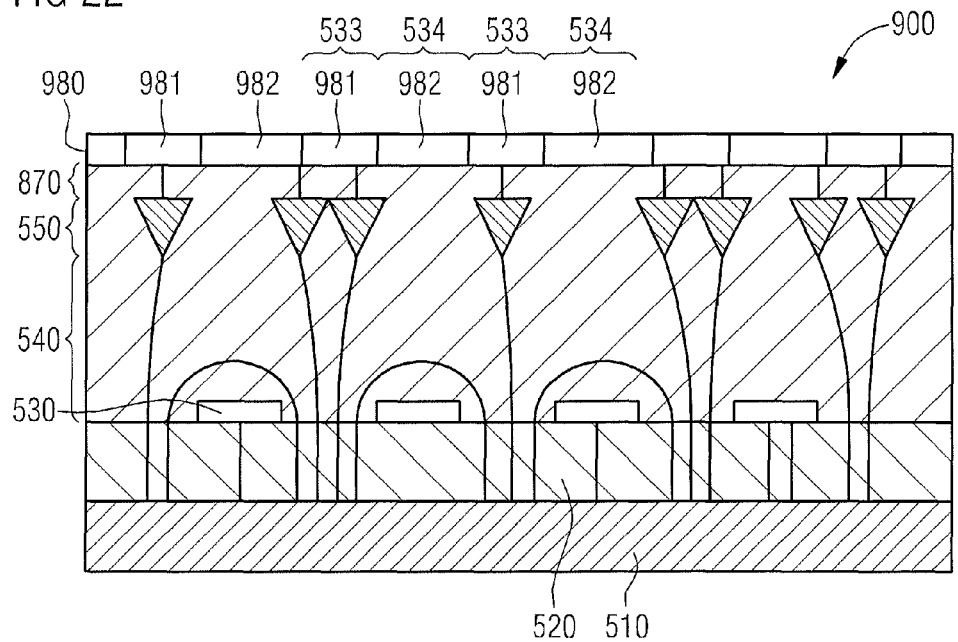
FIG. 22 shows a section through a further layer structure.

FIG. 22 shows a section through a further layer structure 900 in schematic illustration. The layer structure 900 has correspondences to the layer structures 800 and 500 from FIGS. 20 and 12. Corresponding component parts are therefore provided with the same reference signs.

In contrast to the layer structure 800, in the case of the layer structure 900, a contact and mirror layer 980 is arranged on the top side of the further semiconductor layer 870 instead of the contact layer 880. The contact and mirror layer 980 has contact regions 981 and mirror regions 982. The contact regions 981 are arranged above the first lateral regions 533 of the luminous-active layer 550 in a vertical direction (the main growth direction of the layer structure 900). The mirror regions 982 are arranged above the second lateral regions 534 of the luminous-active layer 550 in a vertical direction. The contact regions 981 and the mirror regions 982 can comprise different materials.

The contact regions 981 comprise an electrically conductive material which is particularly well suited to electrical contacting of the further semiconductor layer 870. By way of example, the contact regions 981 can comprise a material having a particularly low contact resistance.

The mirror regions 982 comprise a material that particularly effectively reflects electromagnetic radiation having the wavelength that imitates the luminous-active layer 550 of the layer structure 900. By way of example, the mirror regions 982 can comprise Ag. The contact resistance of the material of the mirror regions 982 is less significant in this case.

The contact regions 981 of the contact and mirror layer 980 serve to produce an electrically conductive connection to the further semiconductor layer 870 of the layer structure 800, in order to excite a vertical current flow through the layer structure 900. Since an injection of charge carriers into the luminous-active layer 550 once again preferably takes place through the V-defects 300 in the first lateral region 533 of the luminous-active layer 550, it suffices for the contact regions 981 to be arranged above the first lateral region 533 of the luminous-active layer 550 in a vertical direction.

Electromagnetic radiation generated by the current flow through the luminous-active layer 550 can leave the layer structure 900 proceeding from the luminous-active layer 550 in the direction of the further semiconductor layer 540. For this purpose, layers of the layer structure 900 that are situated deeper in the growth direction can be separated from the layer structure 900 for example during the production of an optoelectronic component. Radiation emitted in the luminous-active layer 550 in the direction of the further semiconductor layer 870 can be reflected in the mirror regions 982 of the contact and mirror layer 980 and can be reflected back in the direction of the further semiconductor layer 540. The quantity of the electromagnetic radiation which can leave the layer structure 900 overall increases as a result. The efficiency of an optoelectronic component produced from the layer structure 900 increases as a result.

Figure 23:
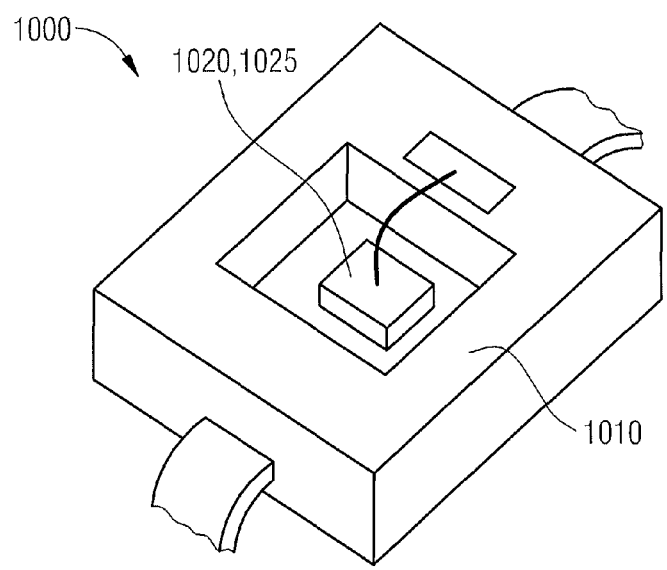
FIG. 23 shows a perspective illustration of an optoelectronic component.

FIG. 23 shows purely by way of example a schematic perspective illustration of an optoelectronic component 1000. The optoelectronic component 1000 can be a light emitting diode, for example. The optoelectronic component 1000 comprises a housing 1010. An LED chip 1020 is arranged on the housing 1010, said LED chip being produced from a layer structure 1025. The layer structure 1025 can be embodied in this case like the layer structure 100, the layer structure 400, the layer structure 410, the layer structure 420, the layer structure 500, the layer structure 600, the layer structure 700, the layer structure 800 or the layer structure 900.

The invention has been illustrated and described in more specific detail on the basis of the preferred exemplary embodiment. Nevertheless, the invention is not restricted to the examples disclosed. Rather, other variations can be derived therefrom by the person skilled in the art, without departing from the scope of protection of the invention.

LIST OF REFERENCE SIGNS

100 Layer structure
101 Growth direction
110 n-doped crystal
120 p-doped crystal
130 Separating layer
131 First thickness
132 Second thickness
200 Luminous-active layer
210 First quantum film
211 First thickness
212 Second thickness
215 First barrier
216 First thickness
217 Second thickness
220 Second quantum film
225 Second barrier
230 Third quantum film
240 First transport direction
250 Second transport direction
300 V-defect
301 First V-defect
302 Second V-defect
310 Facet
320 Opening
330 Vertex
340 Filling
341 Depth
400 Layer structure
401 Prestructured surface
402 Luminous-active layer
403 First lateral region
404 Second lateral region
405 Distance
410 Layer structure
411 Prestructured surface
412 Luminous-active layer
413 First lateral region
414 Second lateral region
415 Distance 416 Group
420 Layer structure
421 Prestructured surface
422 Luminous-active layer
423 First lateral region
424 Second lateral region
425 Distance
500 Layer structure
510 Substrate
520 Semiconductor layer
530 Mask layer
531 Open region
532 Covered region
533 First lateral region
534 Second lateral region
540 Further semiconductor layer
550 Luminous-active layer
560 Defect
561 Blocked defect
562 Canceled defect
563 Continued defect
600 Layer structure
610 Substrate
611 Elevation
612 Depression
613 First lateral region
614 Second lateral region
620 Semiconductor layer
630 Luminous-active layer
640 Further semiconductor layer
660 Defect
700 Layer structure
710 Substrate
711 High elevation
712 Depression
713 First lateral region
714 Second lateral region
715 Low elevation
800 Layer structure
870 Further semiconductor layer
880 Contact layer
881 Closed region
882 Open region
900 Layer structure
980 Contact and mirror layer
981 Contact region
982 Mirror region
1000 Optoelectronic component
1010 Housing
1020 LED chip
1025 Layer structure

The invention claimed is:

1. An optoelectronic component
comprising a layer structure comprising a luminous-active layer, wherein
the luminous-active layer has a higher density of V-defects in a first lateral region than in a second lateral region,
in a plan view at least some of the V-defects have a contour which is given by a hexagon, a dodecagon or a honeycomb-like structure,
at least some of the V-defects which have the contour which is given by a hexagon, a dodecagon or a honeycomb-like structure are arranged at the lattice points of a lattice.

2. The optoelectronic component according to claim 1, wherein the lattice is a rectangular lattice, a hexagonal lattice or a triangular lattice.

3. The optoelectronic component according to claim 1, wherein the lattice is present in the first lateral region.

4. The optoelectronic component according to claim 1, wherein every point of the second lateral region is at a distance from a V-defect in the first lateral region that is not greater than a defined value in a lateral direction, wherein the defined value is between 0.2 μm and 10 μm.

5. The optoelectronic component according to claim 1, wherein the V-defects are distributed in a lateral direction of the layer structure in such a way that each lateral portion of the luminous-active layer in a lateral direction is at most at a maximum distance from a V-defect which corresponds to a charge carrier diffusion length, in particular to a hole diffusion length.

6. The optoelectronic component according to claim 5, wherein at least some lateral portions of the luminous-active layer of the layer structure, in particular each lateral portion of the luminous-active layer of the layer structure, are supplied with charge carriers injected through V-defects.

7. The optoelectronic component according to claim 1, wherein the density of V-defects varies along a predefined lateral direction.

8. A method for producing an optoelectronic component comprising the following steps:
providing a substrate;
growing a layer structure onto the substrate, wherein the layer structure comprises a luminous-active layer, V-defects are embedded into the luminous-active layer, more V-defects per lateral area are embedded in a first lateral region of the luminous-active layer than in a second lateral region of the luminous-active layer,
in a plan view at least some of the V-defects have a contour which is given by a hexagon, a dodecagon or a honeycomb-like structure,
at least some of the V-defects which have the contour which is given by a hexagon, a dodecagon or a honeycomb-like structure are arranged at the lattice points of a lattice.

9. The method according to claim 8, wherein a mask layer having an opening in the first lateral region is created before the growth of the luminous-active layer.

10. The method according to claim 8, wherein elevations are created at a surface of the substrate and
wherein an elevation is created at the surface of the substrate in the first lateral region.

11. The method according to claim 8, wherein the growth is carried out with MOVPE and wherein during growth at least one of growth conditions is adjusted as follows:
growth temperature of at most 950° C.,
growth pressure of at least 10 mbar.

* * * * *